(12) United States Patent
Martinez

(10) Patent No.: US 6,219,242 B1
(45) Date of Patent: Apr. 17, 2001

(54) APPARATUS FOR COOLING A HEAT PRODUCING MEMBER

(76) Inventor: Raul Martinez, P.O. Box 151526, Los Angeles, CA (US) 90015

( * ) Notice: Subject to any disclaimer, the term of this patent is extended or adjusted under 35 U.S.C. 154(b) by 0 days.

(21) Appl. No.: 09/427,049

(22) Filed: Oct. 21, 1999

(51) Int. Cl.$^7$ .................................................. H05K 7/20
(52) U.S. Cl. .................... 361/704; 361/707; 361/687; 361/695; 257/717; 165/121
(58) Field of Search ............................ 361/683–689, 361/690–697, 702–712; 257/709–727; 174/15.2, 16.3, 252, 15.1; 165/121, 122, 165, 185, 104.33, 104.34, 80.2, 80.3, 80.4; 62/51.2; 428/184; 415/177

(56) References Cited

U.S. PATENT DOCUMENTS

| | | | |
|---|---|---|---|
| 1,884,094 | * | 10/1932 | Modine . |
| 4,327,398 | * | 4/1982 | Christison ............................ 361/384 |
| 5,132,780 | * | 7/1992 | Higgins .................................. 357/81 |
| 5,297,005 | * | 3/1994 | Gourdine ............................. 361/697 |
| 5,419,679 | * | 5/1995 | Gaunt et al. ........................... 415/90 |

FOREIGN PATENT DOCUMENTS

0860874A2 * 2/1997 (EP) ............................ H01L/23/467

* cited by examiner

Primary Examiner—Leo P. Picard
Assistant Examiner—Michael Datskovsky
(74) Attorney, Agent, or Firm—James E. Brunton

(57) ABSTRACT

A heat extraction and cooling system which can be attached to the central processing unit (CPU) of a computer for exchanging heat through an enclosure which houses a ducted fan. The apparatus includes a dual section rotary blade system that is driving by a conventional direct current motor. The apparatus also includes a heat conducting base that is placed in thermal engagement with the CPU. Attached to the base is a uniquely configured heat dissipating member which includes a plurality of upstanding heat dispensing fins, a generally conically shaped shroud and is provided with a plurality of apertures for drawing the flow of cooling air through the shroud and past the fins of the heat dissipating member. The dual section rotary blade system pulls air inwardly through the apertured shroud, past the heat dissipating fins and into the hub portion of the rotary blade system. The heat air is then forced into the interior of the uniquely configured, hollow blades which are attached to the hub portion. Each of the blades is provided with a leading edge portion and trailing edge portion having a plurality of small apertures formed therein. As the blades rotate, a negative pressure is formed proximate the trailing edge of each blade and the heated gases are expelled through the small apertures. This provides a jet thrust action to the rotating assembly and causes the heated gases expelled from the hollow blades to expand rapidly thereby producing an additional cooling effect.

25 Claims, 5 Drawing Sheets

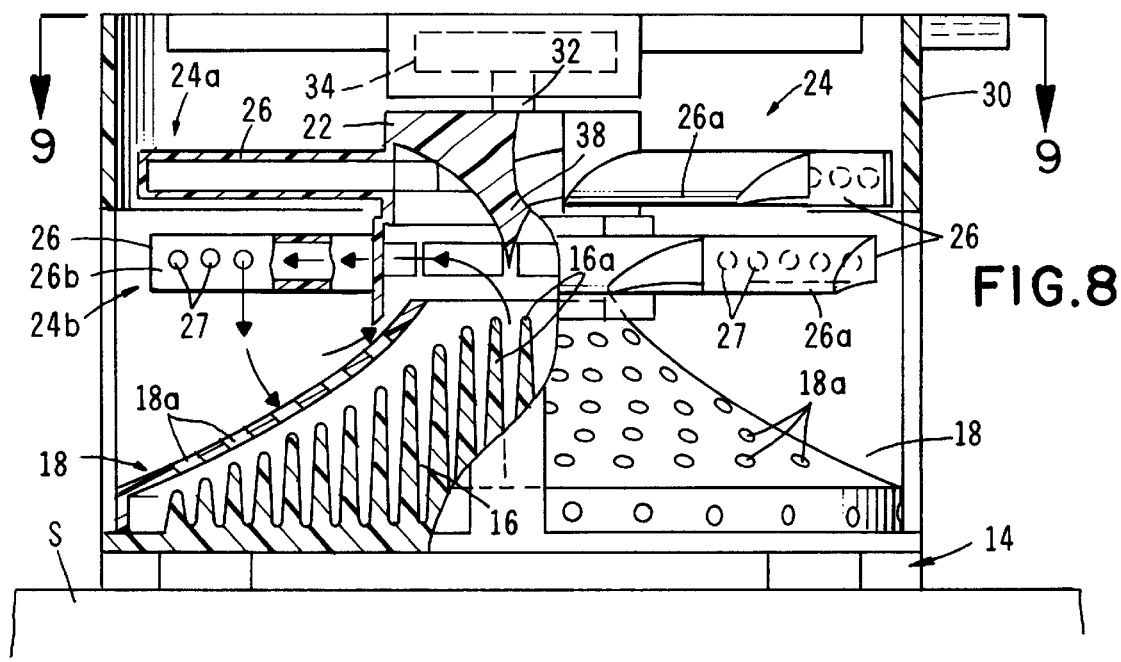
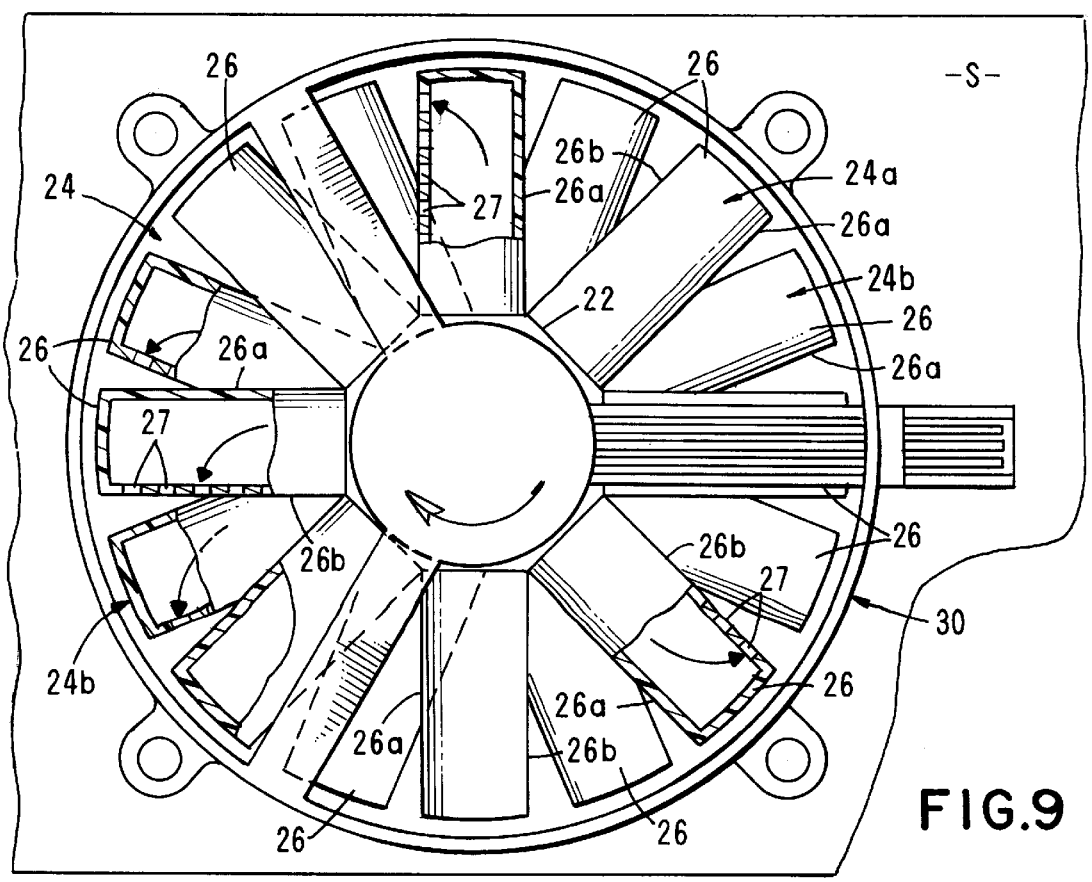

APPARATUS FOR COOLING A HEAT PRODUCING MEMBER

BACKGROUND OF THE INVENTION

1. Field of the Invention

The present invention relates generally to cooling systems. More particularly, the invention concerns an apparatus for cooling a heat producing member such as a computer chip or the like.

2. Discussion of the Prior Art

During operation integrated circuit devices, such as computers generate significant amounts of heat. In order to maintain optimal performance this heat must be continuously removed. If the heat is not continuously and efficiently removed, the device may over heat resulting in reduction of operating performance and possible catastrophic damage. In order to avoid over heating, thermal management devices must be used. Prior art thermal management devices typically comprise heat sinks, thermal interface materials, fans, chassis ventilation, and combinations thereof.

As computer technology advances toward faster speeds and higher performance, thermal management becomes increasingly important. Maintaining the proper thermal environment in the computer system is key to reliable, long-term system operation. Typically, thermal management devices such as heat sinks induce improved heat dissipation through the heat dissipating surface areas coupled with strategically directed air flow from a fan disposed proximate the heat dissipating surface area.

The conventional prior art heat sink is formed of a material such as aluminum that readily conducts heat. The heat sink is usually placed on top of and in contact with the integrated circuit device. Through this contact, heat generated by the integrated circuit is conducted into the heat sink and away from the integrated circuit. Typically the heat sink includes a plurality of cooling fins which function to increase the surface area of the heat sink and thus maximize the transfer of heat from the heat sink device into the surrounding air. In this manner the heat sink draws heat away from the integrated circuit and transfers the heat into the surrounding air. A heat sink and fan combination can deliver better thermal performance than a heat sink alone. Accordingly, in order to enhance the cooling capacity of the heat sink, an electrically powered fan is often mounted on the top of the heat sink. Exemplary of this type of heat sink device is that disclosed in U.S. Pat. No. 5, 794,685 issued to Dean. Another prior art patent that discloses the use of a fan to carry heat away from the central processing unit is U.S. Pat. No. 5,740,014 issued to Lin. Still another heat sink device having radial heat and air flow paths is disclosed in U.S. Pat. No. 5,794, 685 issued to Dean.

The present invention is directed to a novel heat sink device that provides a uniquely configured heat dissipating member that functions to efficiently transfer into the surrounding air heat generated by the integrated circuit device. Cooperating with the heat dissipating member is a novel multi-bladed fan assembly that is so constructed and arranged as to draw air past the heat dissipating member and into the interior of the specially configured blades of the fan assembly of the apparatus.

As will be better appreciated from the discussion that follows, the novel cooling apparatus of the present invention cools the heat producing member in several ways. First, the heat from the heat producing member, such as the computer chip, is radiated from the multiplicity of fins of the heat dissipating member outwardly toward a generally truncated, conically-shaped, apertured shroud that surrounds the heat dissipating member. Second, intake air is drawn through the multiplicity of apertures formed in the shroud by a novel rotary fan blade assembly. Air drawn through the shroud flows past the novel heat dissipating member to cool the member by convection and is then directed into the hollow hub of the rotary fan assembly. Connected to the hollow hub are sixteen uniquely configured hollow fan blades, each of which has an apertured trailing edge. The heated gases emerging from the small apertures provided in the trailing edge of each blade create a jet thrust action to the rotating assembly and expand rapidly to produce an additional cooling effect. The heated air radiated from the heat dissipating member is further cooled as it is drawn past the shroud by the fan blades and then around and about the exterior of each of the hollow blades. The heated air passes completely around the exterior, surface of each and every blade from the root of the blade to the extreme tip. This produces a temperature drop not only within the hollow blade, but around the blade and the hub assembly as well.

SUMMARY OF THE INVENTION

By away of summary, a primary object of the present invention is to provide a heat extraction and cooling system which can be readily attached to a heat producing system such as the central processing unit (CPU) of a computer for exchanging heat through an enclosure which houses a ducted fan. The apparatus of the invention is compact and can be quite easily mounted directly onto the CPU. In the preferred form of the invention the apparatus includes a dual section rotary blade system that is driven by a conventional direct current motor. The apparatus also includes a heat conducting base that is placed in thermal engagement with the CPU. Attached to the base is a uniquely configured heat dissipating member which includes a plurality of upstanding heat dissipating fins. A generally conically shaped shroud surrounds the heat dissipating member and is provided with a plurality of apertures for drawing a flow of cooling air through the shroud and past the fins of the heat dissipating member. The duel section rotary blade system pulls air inwardly through the apertured shroud, past the heat dissipating fins and into the hub portion of the rotary blade system. The heated air is then forced into the interior of the uniquely configured, hollow hub blades which are attached to the hub portion. Each of the blades is provided with a leading edge portion and a trailing edge portion having a plurality of small apertures formed therein. As the blades rotate, a negative pressure is formed proximate the trailing edge of each blade and the heated gases are expelled through the small apertures. This provides a jet thrust action to the rotating assembly and causes the heated gases expelled from the hollow blades to expand rapidly thereby producing an additional cooling effect.

It is an object of the present invention to provide a highly efficient thermal management system for effectively cooling a heat producing member such as a computer CPU.

More particularly, it is an object of the invention to provide a thermal management system of the character described which cools the heat producing of member by a number of heat dissipating mechanisms, including radiation, convection and expansion of heated gases.

Another object of the invention is to provide a system for cooling a CPU which provides a highly efficient heat extraction system to effectively carry away unwanted heat from the CPU.

Another object of the invention is to provide a system of the character described in the preceding paragraphs which improves the control of unwanted heat from the aluminum heat sink of the apparatus that is in thermal engagement with the CPU.

Another object of the invention is to provide an apparatus which will substantially reduce the temperature of the CPU and efficiently establish and maintain temperatures well below acceptable levels, thereby permitting the CPU to operate at higher clock speeds.

Another object of the invention is to provide a system of the character described in the preceding paragraphs which allows the CPU manufacturers to design and build chip architecture to operate at substantially higher clock speeds.

BRIEF DESCRIPTION OF THE DRAWINGS

FIG. 8 is a cross-sectional view similar to FIG. 2, but showing an alternate form of the cooling apparatus of the invention.

FIG. 9 is a cross-sectional view taken along lines 9—9 of FIG. 8.

DESCRIPTION OF THE INVENTION

Figure 1:
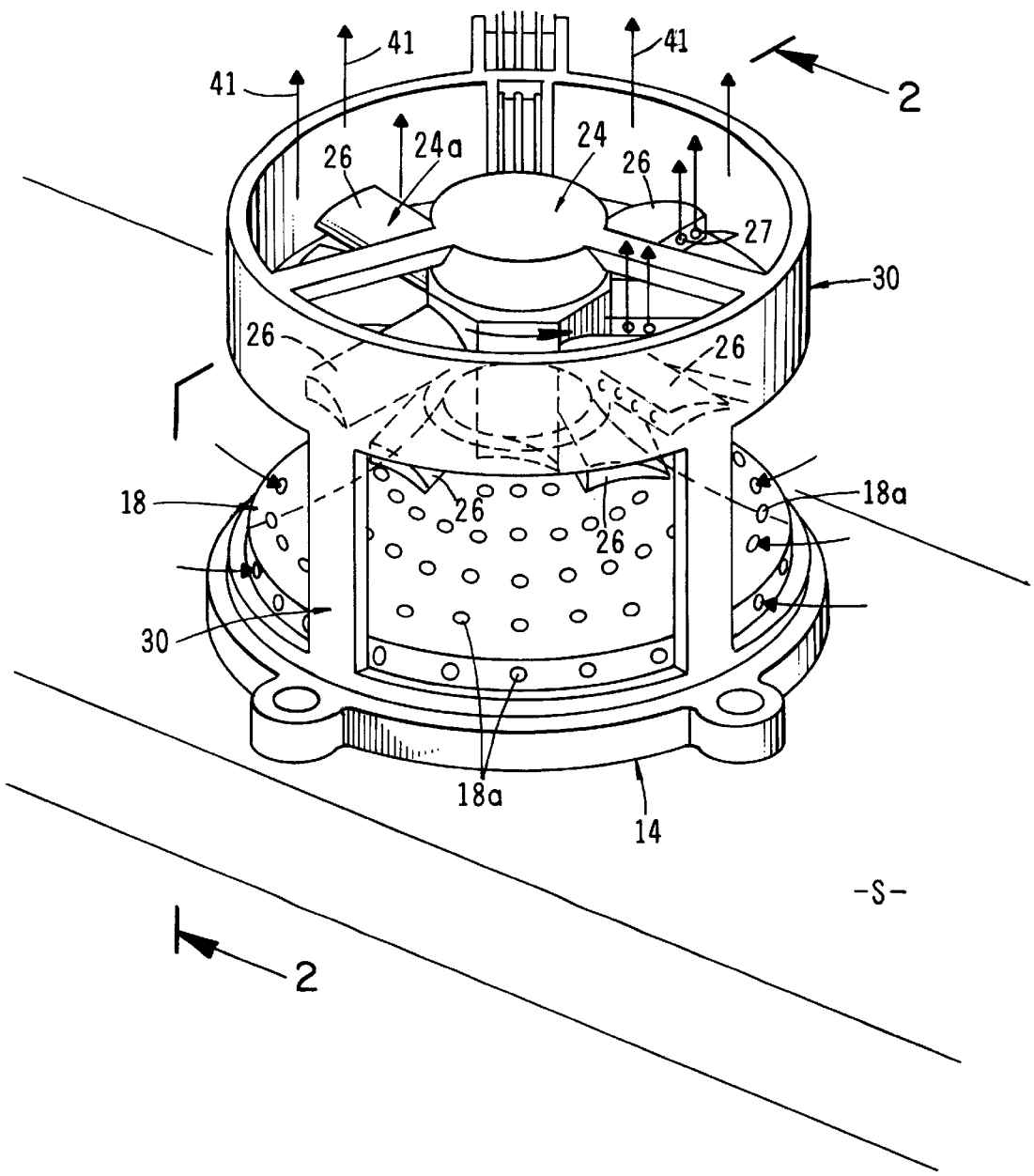
FIG. 1 generally perspective view of one form of the cooling apparatus of the present invention for cooling a heat producing member.

Referring to the drawings and particularly to FIGS. 1 through 4, one form of the present invention for cooling a heat producing system "S" can be seen to comprise extraction means for extracting heat from heat producing system, radiation means operably coupled with the extraction means for radiating heat therefrom to produce heated air, air intake means for drawing the heated air away from the radiation means, capture means operably associated with the air intake means for capturing the heated air, and expelling means for expelling heated air from the capture means in a manner such that it will rapidly expand thereby cooling the heated air.

In the form of the invention shown in the drawings, the extraction means comprises a heat conducting base 14 which is connected to and is in thermal engagement with be heat producing system "S". Affixed to base 14 is the radiation means of the invention, which here comprises a uniquely configured heat dissipating member 16. As best seen by referring to FIGS. 2 and 8, heat dissipating member 16 is generally conical in shape and includes a multiplicity of spaced apart heat dissipating fins 16a. Surrounding heat dissipating member 16 is a generally truncated, conically shaped shroud 18 which forms a part of the air intake means of the present invention.

Figure 2:
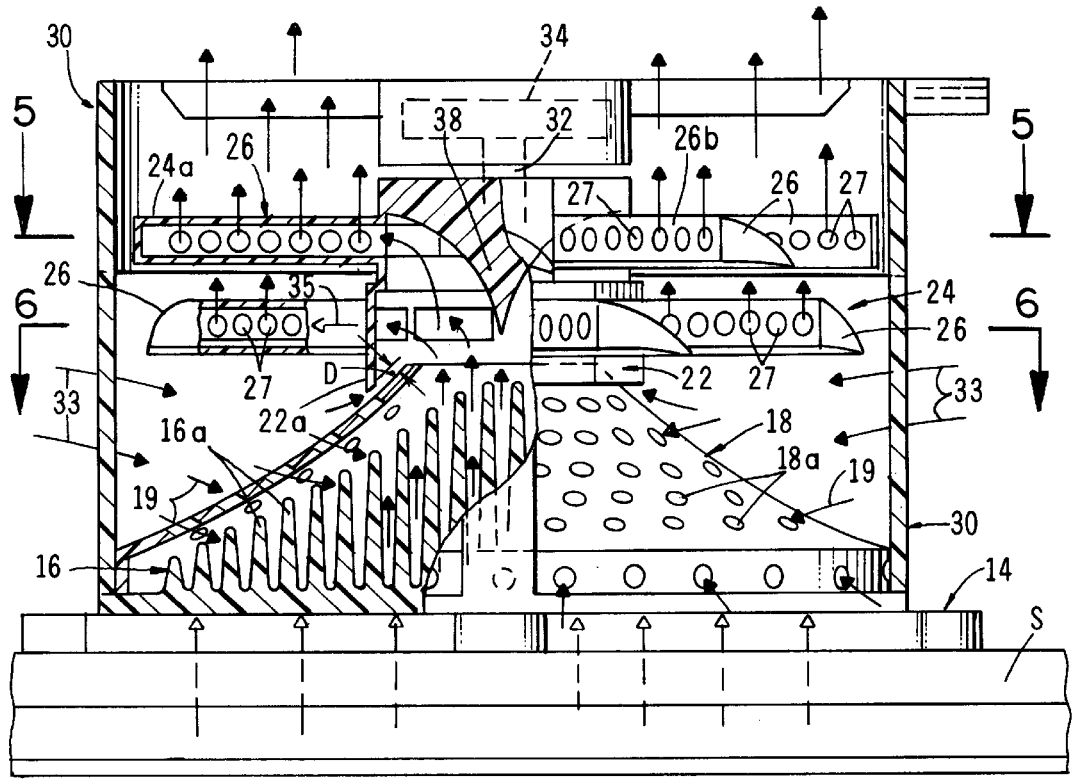
FIG. 2 is a cross-sectional view taken along lines 2—2 of figure .
Figure 3:
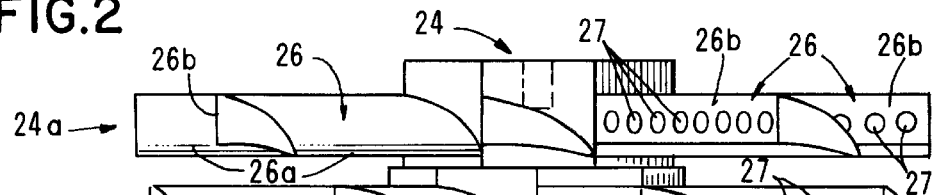
FIG. 3 is an enlarged, side-elevational view of one form of the rotary fan blade assembly of the apparatus.
Figure 4:
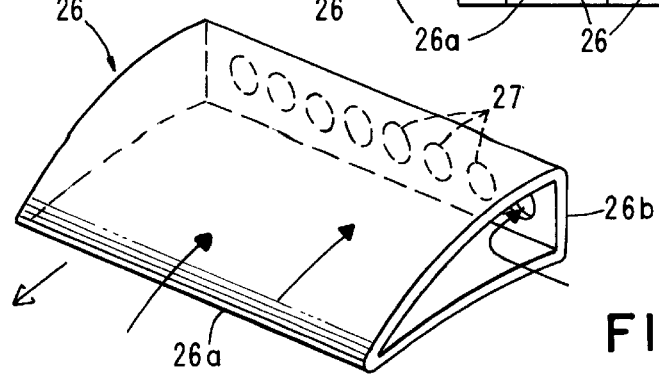
FIG. 4 is a greatly enlarged generally perspective view of one of the fan blades of the fan blade assembly of the invention.
Figure 5:
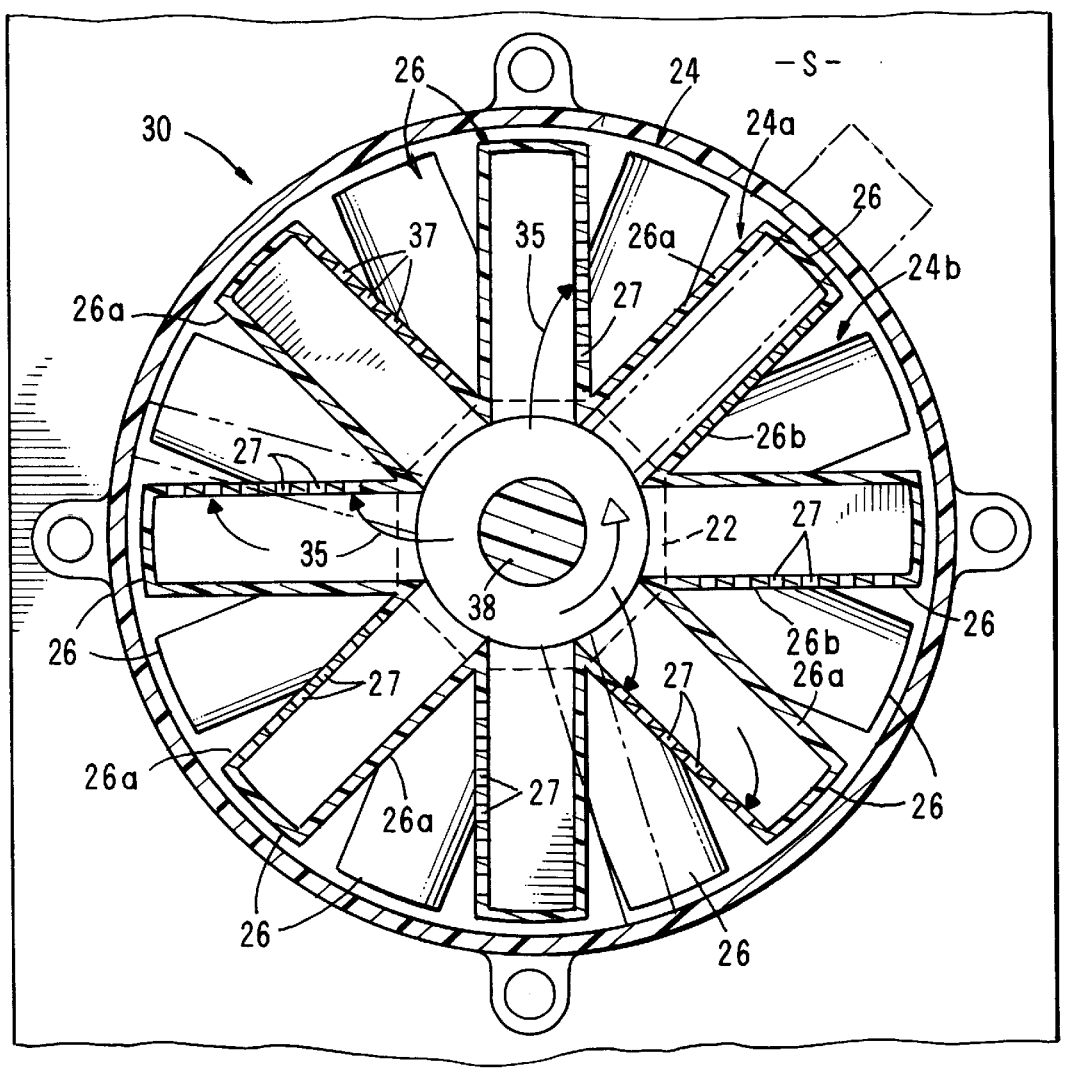
FIG. 5 is a cross-sectional view taken along lines 5—5 of FIG. 2.
Figure 7:
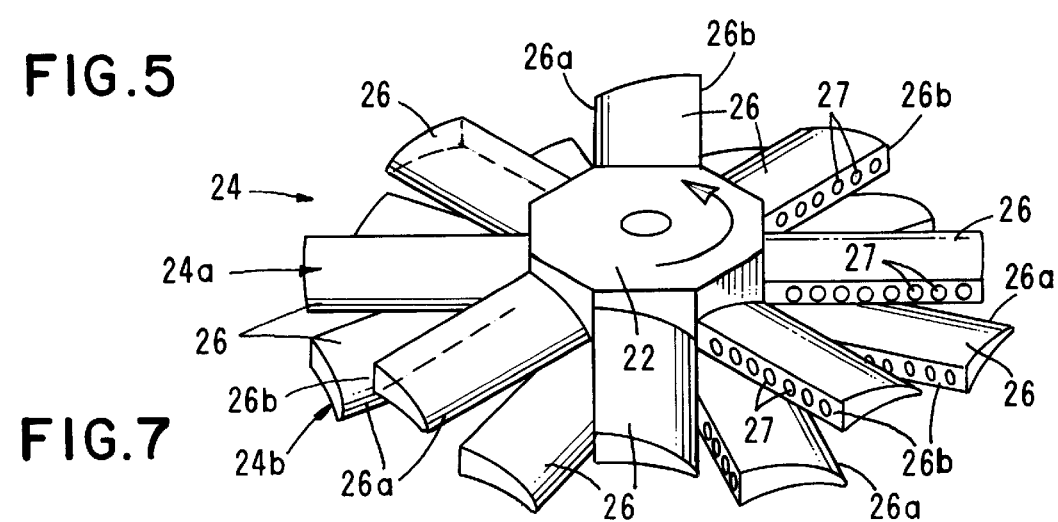
FIG. 7 is a generally perspective view of one form of the fan blade assembly of the apparatus of the present invention.

As best seen in FIG. 2, shroud 18 surrounds and is slightly spaced apart from the upper extremities of cooling fins 16a. Shroud 18 is provided with a multiplicity of apertures 18a, which permit air to flow inwardly in the direction of the arrows 19 of FIG. 2 and toward upstanding fins 16a. As the air is drawn inwardly, it will flow past fins 16a and upwardly into a hollow hub 22 which forms a part of the rotary fan blade assembly 24 of the invention. Fan blade assembly 24, which also forms a part of the air intake means of the invention, is comprised of a dual section fan blade assembly with the sections 24a and 24b offset axially from each other (FIG. 5). Each of the sections 24a and 24b include eight generally air foil shaped blades 26. The blades of each section are angularly staggered or offset in the manner shown in FIG. 5. Each of the blades 26 is similarly shaped and includes a leading edge 26a and a trailing edge 26b. As best seen in FIG. 4, the trailing edge 26b of each of the uniquely shaped hollow blades is provided with a plurality of spaced apart apertures 27 the purpose of which will presently be described.

Referring once again to FIG. 1, an open sided support 30 is affixed to base 14 and extends upwardly therefrom. Drive means are connected to support 30 and function to drive the rotary fan blade assembly by a means of a downwardly extending drive shaft 32 (FIG. 2). The drive means here comprises a small electric motor which rotates the fan blade assembly at a relatively high-speed. As best seen by referring to FIG. 2, the drive means of the invention positions the rotary fan blade assembly so that the lower extremity 22a of hub 22 is spaced apart from shroud 18a by a relatively small distance "D" to form a generally annular shaped air inlet.

With the construction described in the preceding paragraphs, rotation of the fan blade assembly by the drive means, or electric motor 34, will cause the airfoil shaped blades 26 to draw air from the exterior of the unit inwardly in the direction of the arrows 33 through apertures 18, past cooling fins 16a and into hub 22 of the fan blade assembly 24. The heated air will next flow in the direction of the arrows 35 toward the director means of the invention which functions to direct the air into the capture means of the invention which here comprises the interior portions of the hollow airfoil shaped blades 24. As indicated in FIG. 2, cool air will also flow into hub 22 through the gap formed between the lower extremity of hub 22 and the outer surface of shroud 18. This cooling air will mix with the heated air being drawn away from fins 16a and will tend to cool the air flowing into the interior of each of the blades 24. As best seen in FIG. 2, the director means here comprises a downwardly extending, generally conically shaped director 38.

Figure 6:
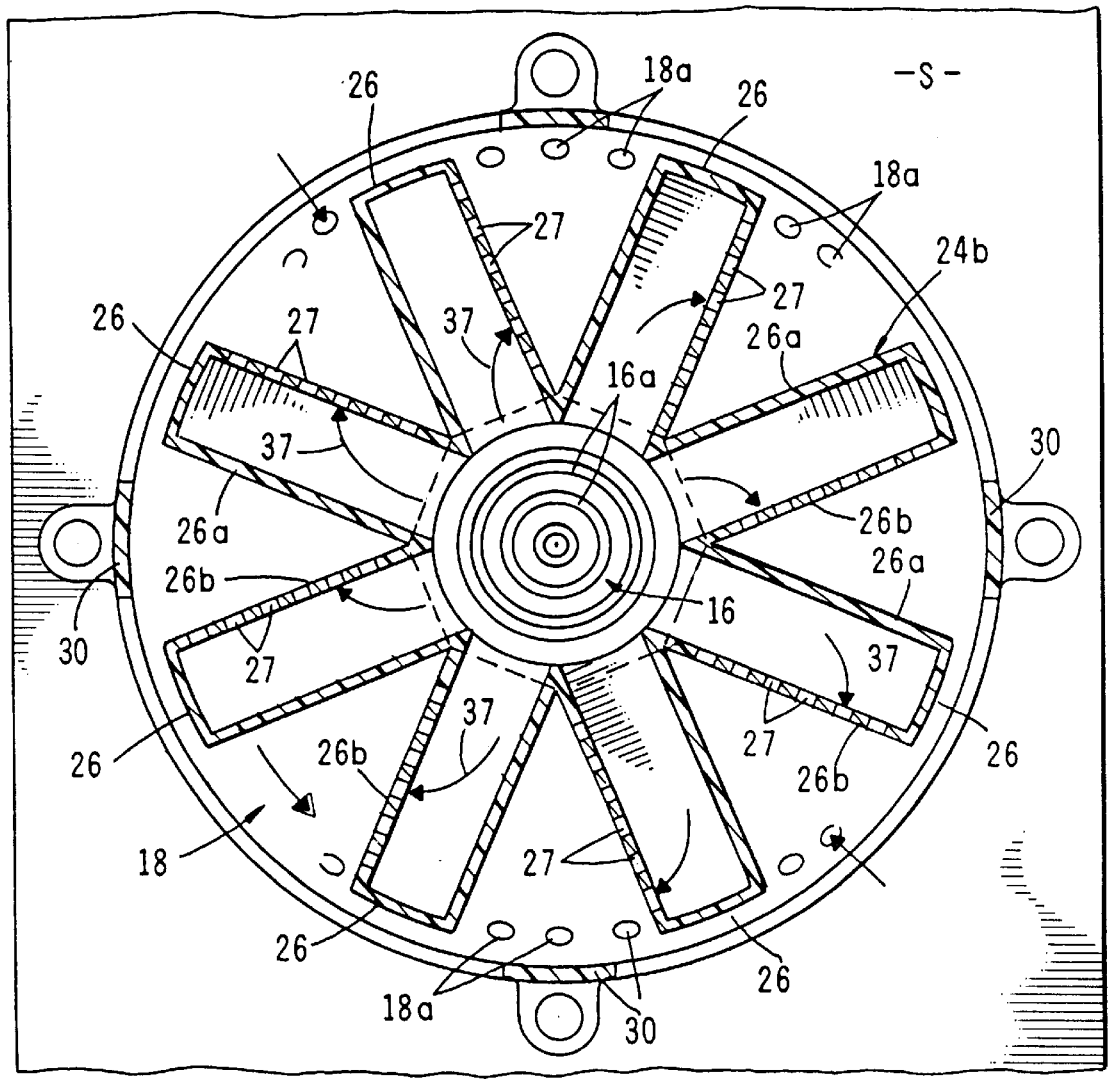
FIG. 6 is a cross-sectional view taken along lines 6—6 of FIG. 2.

The novel heat exchange capability of the apparatus of the invention is caused in part by the aerodynamic action of the fan system which produces negative pressure at the rear of each individual trailing edge of each blade 24. This negative pressure causes the heated gases to be expelled from the small apertures 26b formed in the trailing edge of each blade 26 and uniquely provides a jet thrust action to the rotating assembly. As the gases are expelled from apertures 27 in the direction of the arrows 37 of FIG. 6, the heated gas will expand to produce an additional cooling effect.

As previously mentioned and as indicated by the arrows in FIG. 2, air entering the apertured shroud 18 is drawn past fins 16a of the heat dispensing member and is urged into hollow hub 22 where it is mixed with cool air entering the gap defined between the extremity of hub 22 and the outer surface of shroud 18. At the same time air also passes completely around the exterior contour of each and every blade from the root of the blade to the extremity thereof. This produces a temperature drop not only within the blades themselves, but around the hub assembly as well. In addition to this exterior cooling effect, which efficiently draws heat away from the heat producing system, air entering each of the hollow blades 24 will be expelled therefrom by the expelling means of the invention through small apertures 27 where the heated air will expand to produce the additional cooling effect previously mentioned. As indicated in FIG. 1, the heated air expelled from the apertured blades 26 will be exhausted to atmosphere in the direction of the arrows 41 of FIG. 1 by the exhaust means of the invention which here comprises the top openings formed in support 30. With the construction thus described, the heat producing system "S" is effectively cooled in four ways, namely by heat being conducted away from the system via base 14, by heat radiating from fins 16a of the heat dispensing member, by convection caused by the dual fan assembly, and a by the expansion of the heated air flowing outwardly from the small apertures 27 formed in the trailing edge of each of the sixteen blades 24.

Referring next to FIGS. 8 and 9, an alternate form of the present invention for cooling a heat producing system "S" is there shown. This form of the invention is substantially identical in construction to the form of the invention illustrated in FIGS. 1 through 7. Accordingly, like numbers are used in FIGS. 8 and 9 to identify a like components. The primary difference between this latest embodiment of the invention and that previously described resides in the fact that the duel fan blade assembly rotates in the opposite direction. With this construction a closed heat transfer system is formed with the air flow through the apparatus being in the direction indicated by the arrows in FIG. 8. More particularly, with the duel fan blade assembly rotating in the opposite direction, air drawn into the individual blades of the fan assembly will be forced outwardly and downwardly through the apertures 27 formed in the trailing edge of each blade. This expelled air will then flow through the apertures 18a provided in shroud 18, past the cooling fins of the heat dispensing member 16 and then back into the hollow blades of the rotating fan blade assembly. This circulatory flow of air results in the continuous transfer of air past the cooling fins of the heat dispensing member and into the interior of each of the rotating blades and then back over the cooling fins via apertures 18a provided in shroud 18. As in the earlier described embodiment of the invention, heat from a heat producing source "S" is transferred by conduction from base 14 to heat dissipating member 16. The heated air thus formed is transferred from the interior of shroud 18 into the interior of each of the sixteen rotating blades of the fan assembly in the manner illustrated by the arrows of FIG. 8. The heated air residing within the blades will then be expelled through apertures 27 and will re-circulate through the shroud 18 in the manner indicated in FIG. 8 .

Having now described the invention in detail in accordance with the requirements of the patent statutes, those skilled in this art will have no difficulty in making changes and modifications in the individual parts of their relative assembly in order to meet specific requirements or condition. Such changes and modifications may be made without departing from the scope and spirit of the invention, as set forth in the following claims.

I claim:

1. A cooling apparatus for cooling a heat producing system comprising:
   (a) extraction means for extracting heat from the heat producing system;
   (b) radiation means operably coupled with said extraction means for radiating heat therefrom to produce heated air;
   (c) air intake means for drawing said heated head air away from said radiation means comprising a rotary fan blade assembly disposed proximate said radiation means, said rotary fan blade assembly having a plurality of hollow blades;
   (d) capture means operably associated with said air intake means for capturing said heated air, said capture means comprising at least one of said hollow blades of said rotary fan blade assembly; and
   (e) expelling means for expelling heated air from said capture means and for expanding the heated air to cool the heated air.

2. The cooling apparatus as defined in claim 1 in which said extraction means comprises a base in thermal engagement with the heat producing system.

3. The cooling apparatus as defined in claim 2 in which said radiation means comprises a heat dissipating member in thermal engagement with said base.

4. The cooling apparatus as defined in claim 3, in which said air intake means comprises an apertured shroud surrounding said heat dissipating member.

5. The cooling apparatus as defined in claim 4 in which said air intake means further comprises a rotary fan blade assembly disposed proximate said apertured shroud.

6. The cooling apparatus as defined in claim 1 and which said expelling means comprises a plurality of apertures formed in said trailing edge of said at least one hollow blade.

7. A cooling apparatus for cooling a heat producing system comprising:
   (a) a rotary fan blade assembly having a hollow hub and a plurality of hollow blades, each including a trailing edge having a plurality of apertures formed therein;
   (b) drive means for diving said rotary fan blade assembly;
   (c) heat dissipating means disposed proximate the heat producing member for dissipating heat therefrom;
   (d) air intake means for feeding intake air past said heat dissipating means into said hollow hub of said rotary fan blade assembly; and
   (e) exhaust means for exhausting said intake air to atmosphere whereby the flow of intake air past said heat dissipating means into said hollow hub of said rotary fan blade assembly and out through said exhaust means dissipates heat from the heat producing member.

8. The apparatus as defined in claim 7 in which said dissipating means comprises a base disposed in thermal contact with the heat producing member and a plurality of upstanding heat dissipating fins connected to said base.

9. The apparatus as defined in claim 8 in which said air intake means comprises a generally truncated, conically shaped shroud surrounding said heat dissipating fins, said shroud having a multiplicity of apertures formed therein and an outlet disposed proximate said hollow hub for feeding air flowing past said fins into said hollow hub.

10. The apparatus as defined in claim 9 in which said outlet of said shroud is spaced apart from and cooperates with said hollow hub to define an annular shaped air inlet for permitting air to flow into said hollow hub through said annular shaped air inlet.

11. The apparatus as defined in claim 9 in which said rotary fan blade assembly is comprised of a dual section fan blade assembly with sections offset axially from each other.

12. The apparatus as defined in claim 11 in which each section of said dual section blade assembly has eight blades.

13. The apparatus as defined in claim 12 in which said eight blades of each section are angularly staggered around said hollow hub.

14. The apparatus as defined in claim 12 in which said rotary fan blade assembly further includes director means for directing air flowing into said hollow hub toward said hollow blades whereby the air will flow into the hollow blades and out through the apertures formed in the trailing edge thereof toward said exhaust means.

15. The apparatus as defined in claim 12 further including a support structure surrounding said rotary fan blade assembly and said heat dissipating means.

16. A cooling apparatus for cooling a heat producing system comprising:
    (a) a support
    (b) a rotary fan blade assembly mounted within said support, said rotary fan blade assembly having a hollow hub and a plurality of hollow blades, each including a trailing edge having a plurality of apertures formed therein;
    (c) drive means connected to said support for driving said rotary fan blade assembly;
    (d) a heat dissipating assembly disposed proximate the heat producing system for dissipating heat therefrom, said heat dissipating assembly comprising a plurality of heat dissipating fins;
    (e) air intake means for feeding intake air past said plurality of fins in a direction toward said hollow hub of said rotary fan blade assembly; and
    (f) exhaust means for exhausting said intake air to atmosphere whereby the flow of intake air past said heat dissipating fins, into said hollow hub of said rotary fan blade assembly and out through said exhaust means dissipates heat from the heat producing system.

17. The apparatus as defined in claim 16 in which said rotary fan blade assembly further includes director means for directing air flowing into said hollow hub in a direction toward said hollow blade whereby the air will flow into the hollow blades and out through the apertures formed in the trailing edge thereof.

18. The apparatus as defined in claim 16 in which said heat dissipating means further comprises a base disposed in thermal contact with the heat producing system, said plurality of heat dissipating fins being connected to said base, and extending therefrom.

19. The apparatus as defined in claim 16 in which said air intake means comprises a generally truncated, conically shaped shroud surrounding said heat dissipating fins, said shroud having a multiplicity of apertures formed therein and an outlet disposed proximate said hollow hub for feeding air flowing past said fins and into said hollow hub.

20. The apparatus as defined in claim 19 in which said outlet of said shroud is spaced apart from and cooperates with said hollow hub to define an annular shaped air inlet for permitting air to flow into said hollow hub through said annular shaped air inlet.

21. The apparatus as defined in claim 19 in which said rotary fan blade assembly is comprised of a dual section fan blade assembly with sections offset axially from each other.

22. The apparatus as defined in claim 21 in which each section of said dual section blade assembly has eight blades.

23. The apparatus as defined in claim 22 in which said eight blades of each section are angularly staggered around said hollow hub.

24. The apparatus as defined in claim 22 in which said rotary fan blade assembly further includes director means for directing air flowing into said hollow hub toward said hollow blades whereby the air will flow into the hollow blades and out through the apertures formed in the trailing edge thereof toward said exhaust means.

25. A cooling apparatus for cooling a heat producing system comprising:
    (a) extraction means for extracting heat from the heat producing system, said extraction means comprising a base in thermal engagement with the heat producing system;
    (b) radiation means operably coupled with said extraction means for radiating heat therefrom to produce heated air, said radiation means comprising a heat dissipating member in thermal engagement with said base;
    (c) air intake means for drawing said heated head air away from said radiation means, said air intake means comprising an apertured shroud surrounding said heat dissipating member and a rotary fan blade assembly disposed proximate said apertured shroud, said rotary fan blade assembly comprising a plurality of hollow blades, each said blade having a leading edge and a training edge;
    (d) capture means operably associated with said air intake means for capturing said heated air said capture means comprising at least one of said hollow blades of said rotary blade assembly; and
    (e) expelling means for expelling heated air from said capture means and for expanding the heated air to cool the heated air.

\* \* \* \* \*